United States Patent
Das et al.

(10) Patent No.: US 12,126,363 B2
(45) Date of Patent: Oct. 22, 2024

(54) ERROR CANCELLATION DELTA-SIGMA DAC WITH AN INVERTING AMPLIFIER-BASED FILTER

(71) Applicant: Cisco Technology, Inc., San Jose, CA (US)

(72) Inventors: Bibhu Prasad Das, Philadelphia, PA (US); Romesh Kumar Nandwana, Chapel Hill, NC (US); Richard Van Hoesen Booth, Riegelsville, PA (US); Pavan Kumar Hanumolu, Champaign, IL (US); Kadaba Lakshmikumar, Hillsborough, NJ (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 153 days.

(21) Appl. No.: 17/876,679

(22) Filed: Jul. 29, 2022

(65) Prior Publication Data
US 2024/0039554 A1     Feb. 1, 2024

(51) Int. Cl.
H03M 3/00     (2006.01)

(52) U.S. Cl.
CPC ............. H03M 3/324 (2013.01); H03M 3/50 (2013.01)

(58) Field of Classification Search
CPC .......................... H03M 3/50; H03M 3/324
See application file for complete search history.

(56) References Cited

U.S. PATENT DOCUMENTS

| | | | |
|---|---|---|---|
| 5,323,157 A | 6/1994 | Ledzius et al. | |
| 6,067,036 A * | 5/2000 | Mauthe ............... | H03M 7/3022 341/143 |
| 7,365,669 B1 | 4/2008 | Melanson | |
| 7,499,963 B2 * | 3/2009 | Harvey ............... | H03H 11/1217 708/819 |
| 9,258,010 B1 | 2/2016 | Lakshmikumar et al. | |
| 10,084,474 B1 * | 9/2018 | Wang ....................... | H03M 3/50 |
| 10,833,699 B1 * | 11/2020 | Maheswaran ........... | H03M 3/50 |
| 11,463,101 B2 * | 10/2022 | Zhang .................... | H03M 3/464 |
| 2004/0021594 A1 * | 2/2004 | Melanson ........... | H03M 7/3006 341/143 |

(Continued)

OTHER PUBLICATIONS

Lieyi Fang, "A High-Speed, High-Resolution Sigma-Delta Modulator Analog-to-Digital Converter," Texas Tech University, PhD Dissertation, https://ttu-ir.tdl.org/bitstream/handle/2346/10275/31295019458222.pdf, May 2004, 161 pages.

(Continued)

Primary Examiner — Lam T Mai
(74) Attorney, Agent, or Firm — Edell, Shapiro & Finnan, LLC

(57) ABSTRACT

An apparatus includes a delta-sigma modulator digital-to-analog converter section having a multiple stag cascaded error cancellation architecture, each stage including a delta-sigma modulator followed by a digital-to-analog converter, the delta-sigma modulator digital-to-analog converter section configured to receive a digital input and to generate an analog output. An inverting amplifier-based analog filter is coupled to receive the analog output, the inverting amplifier-based analog filter configured to filter the analog output to produce a filtered analog output.

20 Claims, 7 Drawing Sheets

(56) References Cited

U.S. PATENT DOCUMENTS

| | | | |
|---|---|---|---|
| 2005/0099327 A1* | 5/2005 | Robinson | H03F 3/24 341/143 |
| 2005/0128115 A1* | 6/2005 | Wiesbauer | H03M 3/32 341/143 |
| 2007/0126615 A1* | 6/2007 | Kim | H03M 3/352 341/144 |
| 2007/0171109 A1* | 7/2007 | Mitteregger | H03M 3/37 341/143 |
| 2007/0194855 A1* | 8/2007 | Mitteregger | H03F 3/45183 330/302 |
| 2007/0216557 A1* | 9/2007 | Ebner | H03M 3/384 341/143 |
| 2008/0100486 A1* | 5/2008 | Lin | H03M 3/352 341/143 |
| 2008/0150776 A1 | 6/2008 | DiGiandomenico et al. | |
| 2010/0164776 A1* | 7/2010 | Yi | H03M 3/502 341/143 |
| 2012/0242521 A1* | 9/2012 | Kinyua | H03M 7/3022 341/143 |
| 2013/0044018 A1* | 2/2013 | Kinyua | H03M 7/3022 341/144 |
| 2013/0234872 A1* | 9/2013 | Lugli | H03M 3/358 341/143 |
| 2015/0084798 A1* | 3/2015 | Nezuka | H03M 3/43 341/143 |
| 2017/0222658 A1 | 8/2017 | Miglani et al. | |

OTHER PUBLICATIONS

Chun-Hsien Su, "A Multibit Cascaded Sigma-Delta Modulator With DAC Error Cancellation Techniques," Texas Tech University, PhD Dissertation, https://ttu-ir.tdl.org/handle/2346/19955, May 2004, 172 pages.

Sonika, et al., "Design and implementation of sigma-delta digital to analog converter," Indian Academy of Sciences, https://link.springer.com/article/10.1007/s12046-018-0868-0, Jun. 2018, 11 pages.

Rahmi Hezar, et al., "A 110dB SNR and 0.5mW Current-Steering Audio DAC Implemented in 45nm CMOS," ISSCC 2010 / Session 16 / High-Performance Data Converters / 16.7, Feb. 9, 2010, 3 pages.

Jesper Steensgaard, et al., "High-Resolution Mismatch-Shaping Digital-to-Analog Converters," https://www.researchgate.net/publication/3896004_High-resolution_mismatch-shaping_digital-to-analog_converters, Jun. 2001, 4 pages.

Robert Adams, et al. "A 113-dB SNR Oversampling DAC with Segmented Noise-Shaped Scrambling," IEEE Journal of Solid-State Circuits, vol. 33, No. 12, Dec. 1998, 8 pages.

* cited by examiner

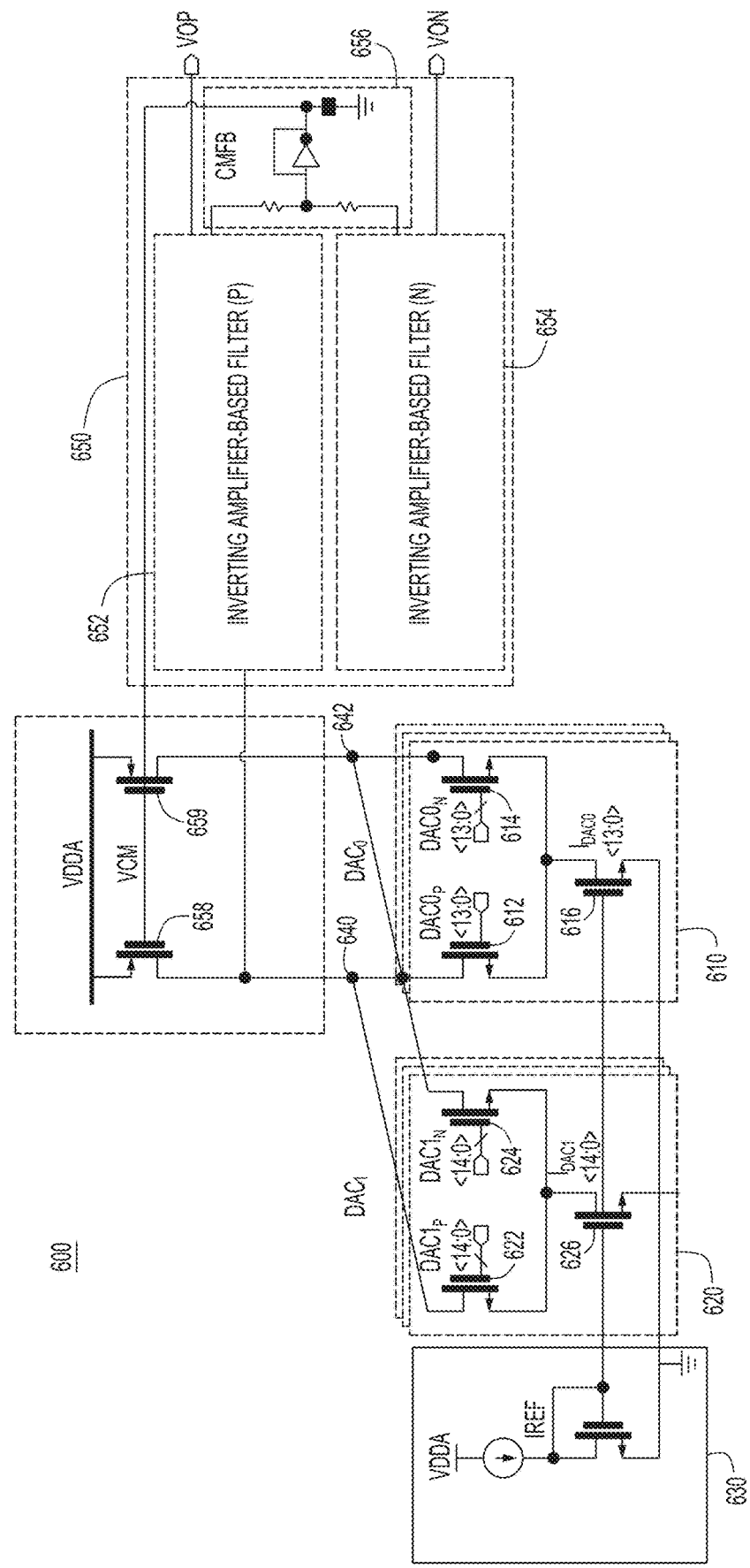

ERROR CANCELLATION DELTA-SIGMA DAC WITH AN INVERTING AMPLIFIER-BASED FILTER

TECHNICAL FIELD

The present disclosure relates to digital-to-analog converters.

BACKGROUND

High-resolution digital-to-analog Converters (DACs) are used for signal-processing and control functions in electro-optical transceivers and other devices. These DACs, along with comparators and firmware loops, are also used as analog-to-digital converters (ADCs) for sensing functions.

Traditionally, Nyquist-rate DACs are used on-chip for these purposes. The chip area of Nyquist-rate DACs increases exponentially with resolution. Segmented DAC architectures can somewhat help reduce area.

In the field of optical communications, there is a push to increase the number of lanes for optical module-based and co-packaged optics (CPO) solutions, such as 100G×8. This means that the number of DACs needed on chip needs to increase in order to support the greater number of lanes. To accommodate the increasing need for more sense and control functionality on an opto-electrical transceiver chip and for other applications, the chip area associated with high-resolution DACs is to be minimized.

BRIEF DESCRIPTION OF THE DRAWINGS

FIG. 6 is a schematic diagram showing digital-to-analog converters and an analog filter of a delta-sigma modulator digital-to-analog converter employing the techniques of an example embodiment.

DESCRIPTION OF EXAMPLE EMBODIMENTS

Overview

In one embodiment, an apparatus is provided that comprises a delta-sigma modulator digital-to-analog converter section having a multiple stage cascaded error cancellation architecture. Each stage of the delta-sigma modulator digital-to-analog converter section includes a delta-sigma modulator followed by a digital-to-analog converter. The delta-sigma modulator digital-to-analog converter section is configured to receive a digital input and to generate an analog output. An inverting amplifier-based analog filter is coupled to receive the digital-to-analog output as input, and to filter the digital-to-analog input to produce a filtered analog output.

EXAMPLE EMBODIMENTS

Figure 1:
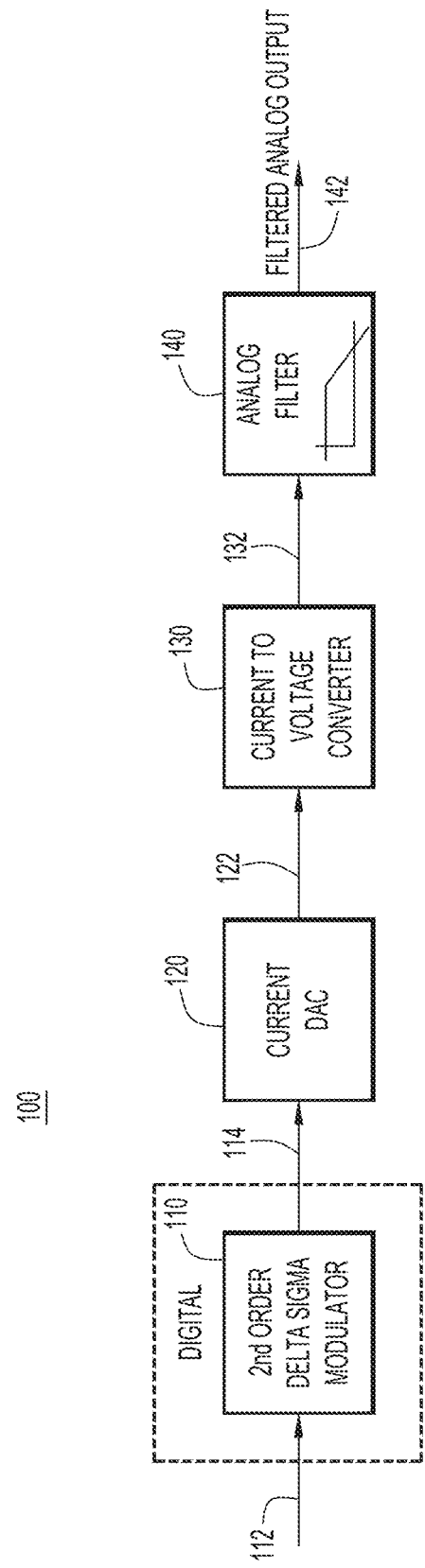
FIG. 1 is a block diagram of a delta-sigma modulator digital-to-analog converter.

Reference is first made to FIG. 1, which shows a block diagram of a delta-sigma digital-to-analog signal converter (DS-DAC) 100. The DS-DAC 100 includes a digital delta-sigma modulator 110 (e.g., 2n d order delta-sigma modulator) that converts a high-resolution high bit-width digital input 112 to a low bit-width oversampled high-speed output 114. The low bit-width high-speed output 114 is provided as a driving input to a current digital-to-analog converter (DAC) 120. The current DAC 120 converts the low bit-width high-speed output 114 to an analog current signal 122. A current-to-voltage converter 130 converts the analog current signal 122 to an analog voltage signal 132. An analog filter 140 serves as a low pass filter to filter out shaped quantization noise from the analog voltage signal 132, and produces a filtered delta-sigma DAC (DS-DAC) analog output 142. The current DAC 120, current-to-voltage converter 130 and analog filter 140 are analog devices. The DS-DAC 100 can also be implemented by using a voltage DAC in place of current DAC 120 and removing the current-to-voltage converter 130.

The area of the digital delta-sigma modulator 110 of the DS-DAC can benefit from technology scaling, and thus as semiconductor fabrication technologies improve, the area of the digital delta-sigma modulator can be reduced. To achieve optimum benefits, the order of the analog filter 140 should be at least one order higher than the order of delta-sigma modulator 110. For example, a second-order delta-sigma modulator 110 should use at least a third-order analog filter. The area of the analog filter 140 generally scales linearly with the order of the filter. Thus, the total area of the DS-DAC 100 can be dominated by the area of the analog filter 140. The goal is to have a DS-DAC that has a small (minimal) footprint.

To illustrate the gain that can be achieved using an analog filter, an unfiltered second-order DS-DAC with over sampling ratio (OSR) of 50 output has a signal-to-noise ratio (SNR) of 17.6 dB, and that can be improved by 35 dB of resolution with a first order analog filter. A third order analog filter gives 69 dB SNR improvement over an unfiltered arrangement, which can realize a 12-bit resolution DAC.

Figure 2:
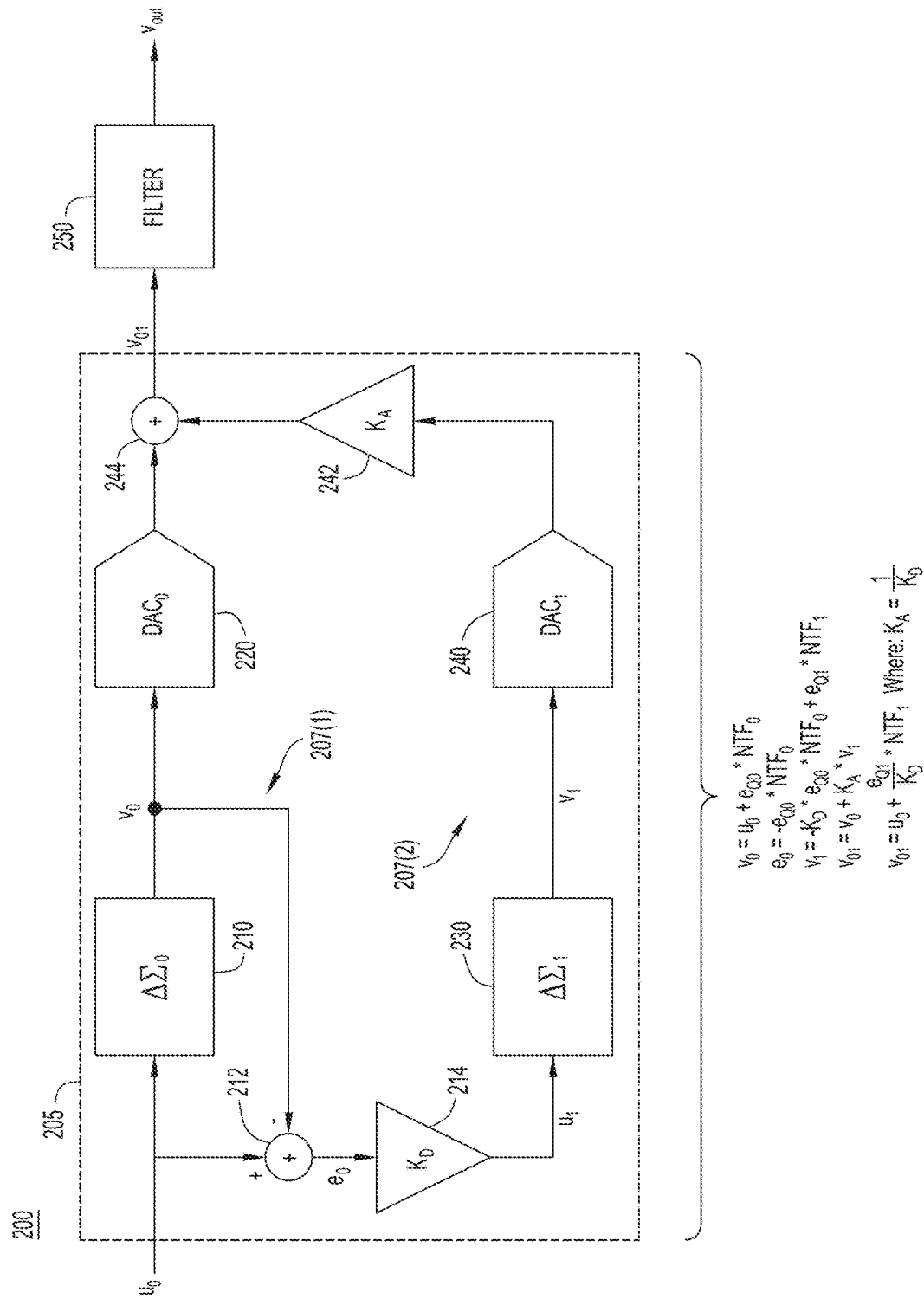
FIG. 2 is a block diagram of a delta-sigma modulator digital-to-analog converter featuring a delta-sigma modulator digital-to-analog converter section having a multiple stage cascaded error cancellation architecture and an inverting amplifier-based analog filter, according to an example embodiment.

The filter order requirement of the analog filter 140 in the DS-DAC 100 can be reduced by using a quantization error cancellation architecture. Reference is now made to FIG. 2, which shows an error cancellation DS-DAC 200 featuring a delta-sigma modulator digital-to-analog converter section having a multiple stage cascaded error cancellation architecture and an inverting amplifier-based analog filter.

More specifically, the DS-DAC 200 has a delta-sigma modulator digital-to-analog converter section 205 comprising two or more cascaded digital delta-sigma modulators in order to achieve better quantization noise cancellation. The delta-sigma modulator digital-to-analog converter section 205 is configured to receive a digital input $u_0$ and to generate an analog output $v_{01}$. Each stage of the delta-sigma modulator digital-to-analog converter section 205 includes a delta-sigma modulator followed by a digital-to-analog converter. For example, the delta-sigma modulator digital-to-analog converter section 205 includes a first stage 207(1) comprising a first digital delta-sigma modulator 210 ($\Delta\Sigma_0$) (also called the main digital modulator) and a first current steering DAC 220 ($DAC_0$), and a second stage 207(2) comprising a second digital delta-sigma modulator 230 ($\Delta\Sigma_1$) and a second current steering DAC 240 ($DAC_1$).

The digital input $u_0$ to the DS-DAC 200 is processed by the first digital delta-sigma modulator 210 to produce a first digital output $v_0$ that is provided to an adder 212. The first output $v_0 = u_0 + eQ_0 * NTF_0$, where $eQ_0$ is the quantization noise of the first delta-sigma modulator 210 and $NTF_0$ is the noise transfer function of the first digital delta-sigma modulator 210.

The adder 212 is configured to subtract digital output $v_0$ from the digital input $u_0$ to produce a first noise shaped error $e_0$. In other words, the adder 212 computes $u_0 - v_0$, which is based on the first output $v_0$ above, $e_0 = -eQ_0 * NTF_0$. The first error $e_0$ (still in the digital domain) is scaled by a scaling factor $K_D$ by a digital scaler 214. The first output $v_0$ is also provided as input to the first current steering DAC 220. The first current steering DAC 220 converts the digital output $v_0$ to a first analog signal.

Thus, the error $e_0$ of the first digital delta-sigma modulator 210 is scaled by digital scaler 214 and the resulting scaled error is provided as input, referred to at this point as $u_1$, to the second digital delta-sigma modulator 230. The scaling is performed so that the error output of first delta-sigma modulator 210 occupies the full input range of second delta-sigma modulator 230. The second digital delta-sigma modulator 230 processes $u_1$ to produce output $v_1$, where $v_1 = K_D * e_0 * NTF_0 + eQ_1 * NTT_1$, where $eQ_1$ is the quantization noise of the second delta-sigma modulator 230 and $NTF_1$ is the noise transfer function of the second digital delta-sigma modulator 230. The scaling performed earlier helps in reducing the relative impact of second delta-sigma modulator 230 quantization noise $eQ_1$. The second DAC 240 converts the output $v_1$ of the second digital delta-sigma modulator 230 to a second analog signal which is scaled (by a scaling factor $K_A = 1/K_D$) by analog amplifier 242 to produce a scaled second analog signal. The adder 244 combines the first analog signal output of the first DAC 220 with the scaled second analog signal of the analog amplifier 242, producing an unfiltered analog output $v_{01}$. The unfiltered analog output of the delta-sigma modulator digital-to-analog converter section 205 is $v_{01} = u_0 + eQ_1/K_D * NTF_1$. This unfiltered analog output $v_{01}$ is coupled as input to the analog filter 250. Analog filter 250 filters the analog output $v_{01}$ to produce a filtered analog voltage $v_{out}$ with reduced quantization noise.

The shaping of the quantization error $e_0$ using the second delta-sigma modulator 230 helps mitigate the impact of mismatch between the first DAC 220 and the second DAC 240. Repeated cascading and subtraction can further reduce the quantization error to arbitrarily small levels. That is, the signal transfer function (STF) of stage i for i=0, 1, 2, 3, . . . . In addition, $K_{Ai} = 1/K_{Di}$. Similarly, $v_{012} = u_0 + eQ_2/(K_{D1} * K_{D2}) * NTF_2$.

As depicted in the FIG. 2, the DS-DAC 200 employs a multi-stage (e.g., two-stage) cascaded error cancellation architecture, which reduces filter order requirement (of the analog filter 250), resulting in a compact area. Moreover, the error cancellation architecture enables a low out-of-band gain (OBG) for the first digital delta-sigma modulator 210 as well for better low frequency error cancellation. This results in achieving better (higher) cancellation of low frequency components, and hence improved in-band SNR.

Again, it is desirable to minimize the number of digital delta-sigma modulators and also have a minimally sized analog filter so that the overall area used by the digital portion and the overall area used by the analog portion is small. To this end, the analog filter 250 may take the form of a single operational amplifier (op-amp) complementary metal oxide silicon (CMOS) inverting amplifier-based filter. By sufficiently cancelling the quantization noise, the DS-DAC 200 minimizes the analog filtering requirement. The overall power and size of the DS-DAC 200 are reduced by having a small amount of analog filtering.

Figure 3:
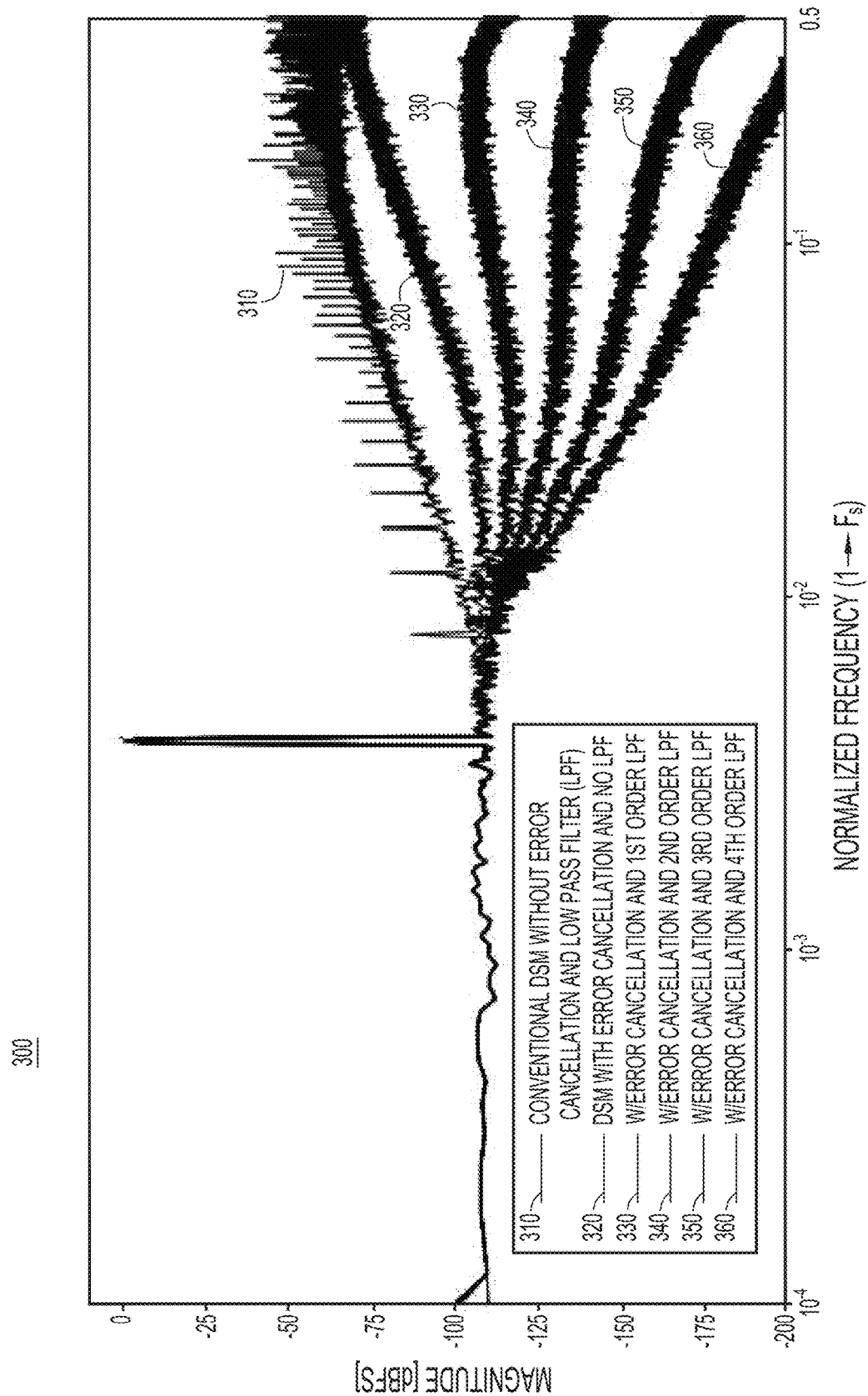
FIG. 3 illustrates plots showing comparisons of performance for different order analog filters with delta-sigma modulators, including performance of the delta-sigma modulator digital-to-analog converter shown in FIG. 2, according to an example embodiment.

Reference is now made to FIG. 3, which shows plots 300 indicating comparisons of performance for different order analog filters. Plot 310 shows the frequency response for a DS-DAC using a single stage delta-sigma modulator, representing $v_0$ in FIG. 2. Plot 320 shows the frequency response for a DS-DAC using a two-stage delta-sigma modulator (without an analog low pass filter), representing $v_{01}$ in FIG. 2. Plots 330-360 show the frequency responses for the filtered signal $v_{out}$ in FIG. 2 with different filter orders of a low pass filter (LPF). Plot 330 shows the frequency response for a DS-DAC using a two-stage delta-sigma modulator with a first order analog LPF. Plot 340 shows the frequency response for a DS-DAC using a two-stage delta-sigma modulator and a second order analog LPF. Plot 350 shows the frequency response for a DS-DAC using a two-stage delta-sigma modulator and a third order analog LPF. Plot 360 shows the frequency response for a DS-DAC using a two-stage delta-sigma modulator and a fourth order analog LPF.

As shown in FIG. 3, if the analog filter 250 is a first order filter, this can improve the SNR by nearly 36 dB (68.5 dB) over an unfiltered 2-stage error cancellation DS-DAC (22.0 dB). If the analog filter 250 is a second order filter, this will further improve the SNR by approximately 18 dB (86.5 dB). The amount of improvement in SNR by increasing the order of the analog filter beyond the second order flattens out.

The CMOS inverting amplifier-based op-amp for the analog filter 250 performs both current-to-voltage (IN) conversion and low-pass filtering. This results in better process scalability for CMOS fin field effect transistor (FinFET) process technology, and a compact layout. A FinFET is a type of non-planar transistor that is built on a substrate, where the gate is placed on two, three or four sides of the channel, or wrapped around the channel, to improve the width-to-length ratio of the transistor.

Figure 4:
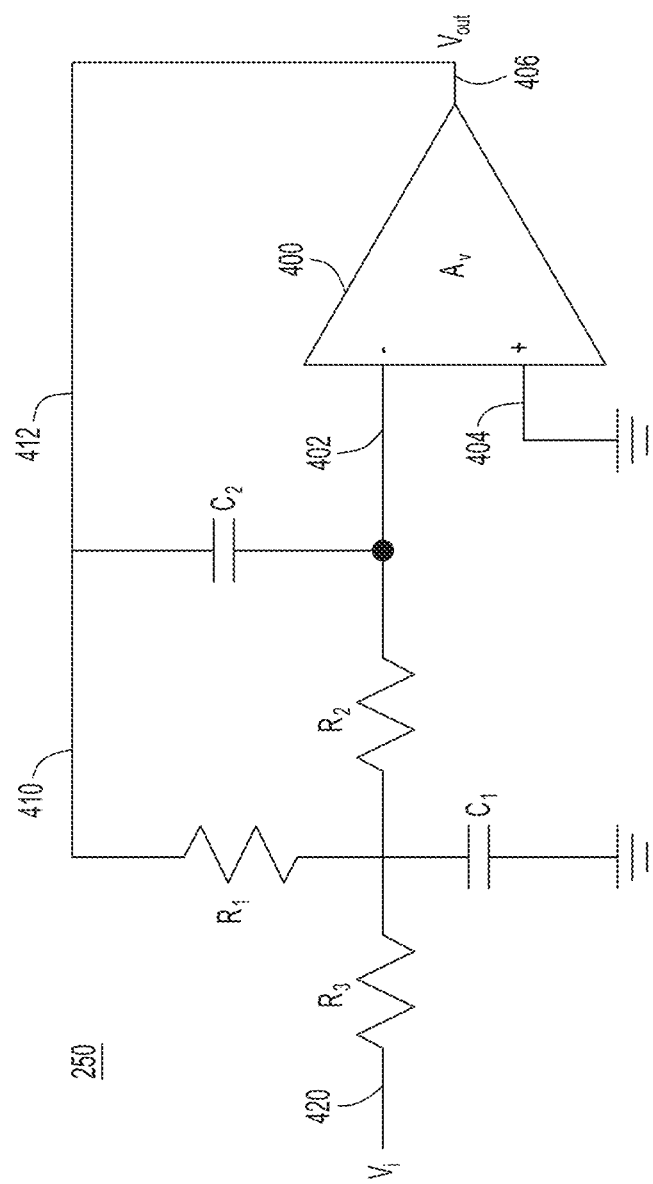
FIG. 4 is a schematic circuit diagram of a single operational amplifier (op-amp) inverting amplifier-based analog filter, according to an example embodiment.

Reference is now made to FIG. 4. FIG. 4 shows a schematic circuit diagram of a single op-amp inverting amplifier analog filter 250. The analog filter 250 improves the SNR with low area. The analog filter 250 may employ a Rauch biquad filter topology to achieve second order filtering with a single op-amp, as described below. As shown in FIG. 4, the analog filter 250 may be a second order filter employing a single op-amp (with inverting topology). The analog filter 250 includes op-amp 400 having an inverting (−) input 402 and a non-inverting (+) input 404 that is coupled to an AC ground. The op-amp 400 has an output ($V_{out}$) 406.

The analog filter 250 may have a Rauch biquad cell configuration that has a multiple feedback filter architecture.

A first feedback path 410 is from the output 406 to resistor $R_1$, which in turn is coupled to capacitor $C_1$ that is coupled to an AC ground. A second feedback path 412 is from the output 406 to capacitor $C_2$, which is connected to the inverting input 402. Resistor $R_2$ is connected between the inverting input 402 and a node between resistor $R_1$ and capacitor $C_1$. Resistor $R_3$ is connected between an input ($V_i$) 420 and resistor $R_2$. The input $V_i$ is the analog output $v_{o1}$ of the delta-sigma DAC modulator section 205 of the DS-DAC 200.

The input to the analog filter 250 can be a current (where $V_i$ and $R_3$ are replaced by an equivalent current). This removes the need for an explicit current-to-voltage converter when using current output DACs. The non-inverting input 404 of the op-amp 400 is coupled to AC-ground. As a result, there is no need for a wide common mode range, which is required by a Sallen-Key filter, such that a smaller op-amp size and power may be achieved. The low input common-mode range requirement enables the use of a single inverter or a cascade of CMOS inverters for the op-amp 400. The circuit arrangement shown in FIG. 4 is a single-stage op-amp arrangement, and by using multiple feedback from the output 406 to the input 420, the analog filter 250 can operate as a second order (low pass) filter.

Figure 5A:
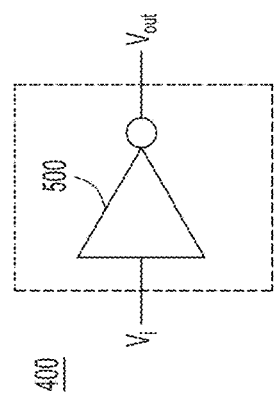
FIG. 5A is a schematic diagram of an op-amp that comprises a single inverter and which is used for the inverting amplifier-based analog filter, according to an example embodiment.

As explained above, the op-amp 400 (of sufficient gain) can be implemented by a cascade of CMOS inverters. FIG. 5A illustrates an example op-amp 400 having a single inverter 500.

Figure 5B:
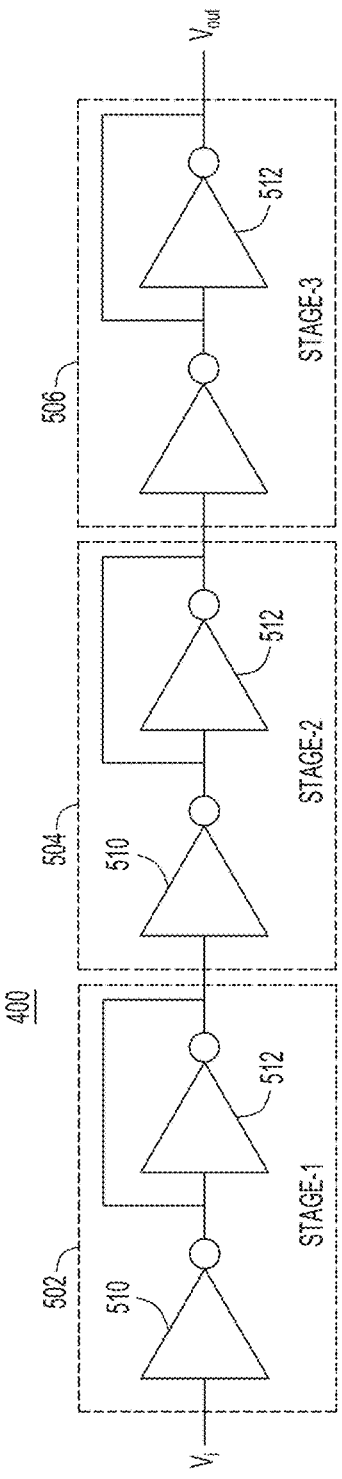
FIG. 5B is a schematic diagram of an op-amp that comprises a multi-stage (e.g., three stage) cascaded transconductance/transconductance (gm/gm) topology, according to an example embodiment.

Referring to FIG. 5B, in one embodiment, the op-amp 400 comprises a multi-stage (e.g., three stage) cascaded transconductance/transconductance (gm/gm) topology. That is, the op-amp 400 comprises first, second and third stages 502, 504 and 506 cascaded together. Each stage comprises two inverters 510 and 512 connected in series, in which an output of the inverter 512 is tied to the input of the inverter 512. The cascade of 3 gm/gm stages as shown in FIG. 5B can provide adequate DC gain while maintaining linearity.

Figure 5C:
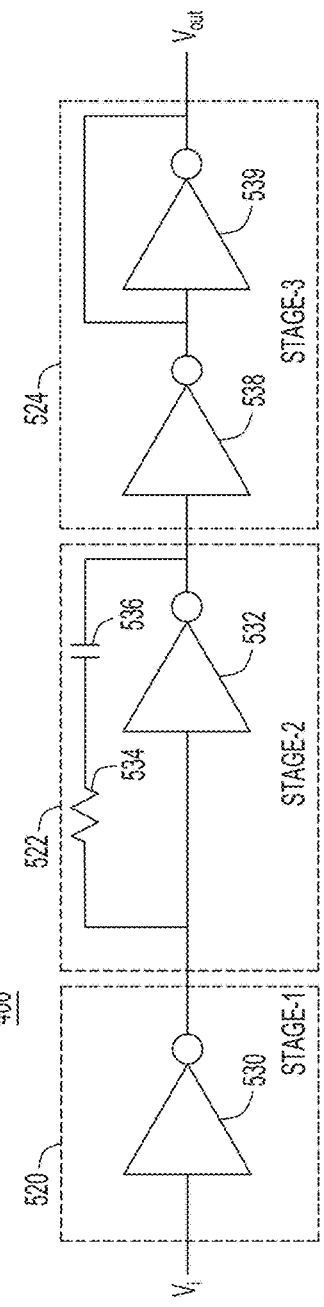
FIG. 5C is a schematic diagram of an op-amp that comprises a multi-stage inverter topology with Miller-compensation, according to an example embodiment.

In another embodiment, as shown in FIG. 5C, the op-amp 400 is a three-stage inverter based op-amp with Miller-compensation. That is, op-amp 400 comprises three stages 520, 522 and 524. The first stage 520 comprises a single inverter 530. The second stage 522 comprises a single inverter 532 having a resistor 534 and capacitor 536 connected in series between the output of the inverter 532 and the input of the inverter 532. Thus, the second stage 522 has a resistor-capacitor network that provides filtering compensation and the first and second stage operate like a Miller-compensated 2-stage op-amp. The third (final) stage 524 comprises inverters 538 and 539 in a gm/gm topology to provide a low output impedance.

Again, to minimize power and area of the analog filter 250, it is better to use a single op-amp, and an inverting amplifier-based implementation for the op-amp has benefits. There are a class of filters called single amplifier biquads that can realize second order transfer functions. The most common biquad is the Sallen-Key filter. With a Sallen-Key filter, one op-amp is needed and it should have a rail-to-rail common mode range. A Sallen-Key filter cannot be realized with an inverter due to the wide input common mode range requirement. A Rauch topology can be realized with an inverter, and thus a Rauch topology can have the manufacturing process and scaling benefits associated with implementing inverter-based filters because inverters are very ubiquitous elements. Also, a Sallen-Key filter can only accept a voltage, not a current, as an input. In a Sallen-Key architecture, it is not possible to replace an op-amp with an inverter, but in a Rauch architecture, the single-op amp can be built with inverters. The analog filter 250 using the Rauch topology with current input performs two functions: converts current to voltage and performs low-pass filtering. By adding one or more resistors and two capacitors, the filtering function is added to the current-to-voltage converter, and in particular, a second order filter.

Reference is now made to FIG. 6. FIG. 6 illustrates a schematic diagram 600 of the DACs and the analog filter of the DS-DAC 200. The delta-sigma modulators are not shown in the schematic diagram 600, for simplicity. In this schematic diagram 600, complementary signal paths are employed, denoted positive (P) and negative (N). Thus, there is a first DAC block 610 for the first/main $DAC_0$ stage of the DS-DAC 200 and a second DAC block 620 for the second $DAC_1$ stage of the DS-DAC 200. A reference current mirror 630 provides a reference current (IREF) to the first DAC block 610 and the second DAC block 620.

Each of the first DAC block 610 and the second DAC block 620 comprises a block of complementary current steering switches and a block of N-channel current sources. That is, the first DAC block 610 comprises 14-unit current sources 616 that receive the bias voltage from the reference current mirror 630. The first DAC block 610 also comprises a first block 612 of P-signal path current switches (14 in number to span bits <13:0>) and a second block 614 of complimentary N-signal path current switches (14 in number to span bits <13:0>). Each set of complementary N-signal path current switches in block 614 is connected with its corresponding DAC unit cell current source 616. Depending on the digital code, the current from current sources 616 is steered through either a switch of the first block 612 or a switch of the second block 614.

Similarly, the second DAC block 620 comprises 15-unit current sources 626 that receive the bias voltage from the reference current mirror 630. The second DAC block 620 also comprises a first block 622 of P-signal path current switches (15 in number to span bits <14:0>) and a second block 624 of N-signal path current switches (15 in number to span bits <14:04 The DAC inputs are provided to the gates of the transistors in blocks 612, 614, 622 and 624. The reference current mirror 630 provides a bias voltage to current sources 616 and 626 that generates the unit cell current $I_{DAC0}$ and $I_{DAC1}$, respectively.

The second DAC block 620 contains 15 unit current sources providing 16 levels and the first DAC block 610 contains 14 unit current sources proving 15 levels. The first DAC block 610 has one less level to match the input signal range since the input signal range is limited to of the input full scale. So one unit cell can be removed to save some area.

The outputs of the first DAC block 610, taken from the drains of the transistors in blocks 612 and 614 of current sources, are combined with the outputs, taken from the drains of the transistors in blocks 622 and 624 of current sources, of the second DAC block 620, at DAC output nodes 640 and 642.

An analog filter block 650 receives as input the current from DAC output nodes 640 and 642, corresponding to the P-signal path and N-signal path, respectively. The analog filter block 650 comprises an inverting amplifier-based filter 652 for the P signal path, an inverting amplifier-based filter 654 for the N signal path, and a common mode feedback (CMFB) circuit 656. The filtered outputs are VOP and VON, as shown in FIG. 6. To maximize the output dynamic range of the filter, the output common mode voltage needs to be maintained at a mid-point (VDD/2) by ensuring that P-channel current sources 658 and 659 provide the current that is nominally 50% of the full-scale current. The CMFB circuit 656 detects the output common mode voltage and provides a common mode voltage signal (VCM) that drives the P-channel current sources 658 and 659 to provide the proper current value to maintain the output common mode voltage (VDD/2). The gain factor $K_A$ is applied by scaling the unit current cell size of $T_{DAC1}$ with respect to $I_{DAC0}$, where $T_{DAC1}=K_A*I_{DAC0}$. This ensures that the least significant bit (LSB) current values are scaled appropriately to the gain factor $K_A$ and provide desired scaling.

As explained above, the analog filter block 650 comprises inverting amplifier-based (e.g., Rauch) filters that also function as current-to-voltage converters. The virtual ground of the analog filter block 650 holds the drain voltage of the current sources (in the DAC blocks 610 and 62) at AC ground. This minimizes non-linearity introduced by the current sources due to drain voltage variations.

The DS-DAC architecture presented herein differs from existing designs, particularly those that use the so-called multi-stage noise shaping (MASH) architecture. In a MASH architecture, unshaped quantization noise of the quantizer of a primary loop is taken and sent to the cascaded loop. The cascaded loop output requires a high-pass filter before adding to the primary loop output. This helps increase the order of the delta-sigma modulator. For example, the first delta-sigma modulator may be a first order modulator, the second delta-sigma modulator is a second order modulator, and the combined effect/result of the first and second delta-sigma modulators is third order. By contrast, in the architecture presented herein, the order of the main/first delta-sigma modulator determines the order of the overall system, e.g., if the main delta-sigma modulator is second order, then the order of the overall system is second order.

Moreover, in the DS-DAC presented herein, the error $e_0$ is not just the quantizer noise, but is the quantizer noise multiplied or shaped by the noise transfer function of the first DAC 220 shown in FIG. 2. The second DAC 240 then cancels the shaped noise as shown in FIG. 2. After the second DAC 240, there is no other extra high-pass filter required to increase the noise shaping order. The unfiltered analog output of the DS-DAC 200 is the input plus the quantization noise $eQ_1$ of the second DAC 240 scaled down by the gain $K_A=1/K_D$ times the noise transfer function of the second DAC 240. In the existing MASH-based designs, the final noise transfer function at the output is $NFT_0 \times NFT_1$, where $NFT_0$ is the transfer function of a first DAC and $NFT_1$ is the transfer function of a second DAC.

Moreover, the MASH type designs increase the noise shaping order, whereas the DS-DAC presented herein does not increase noise shaping order, but cancels the noise. As shown in FIG. 2, the noise from the first stage 207(1) is completely canceled, and all that is left is the noise of the second stage 207(2), which is very small, $eQ_1/KD*NTF_1$.

Figure 7:
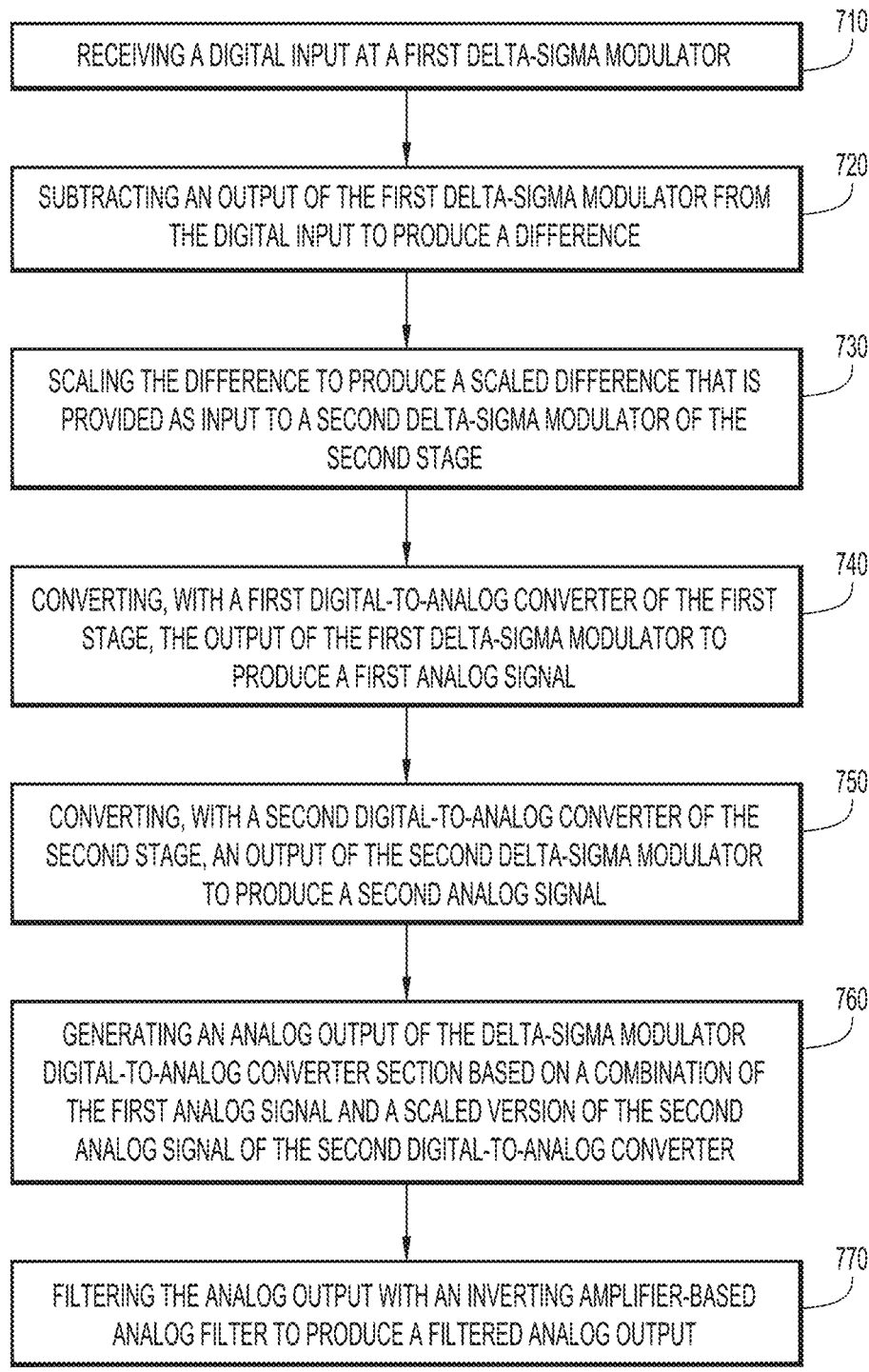
FIG. 7 illustrates a flow chart depicting a method according to an example embodiment.

Reference is now made to FIG. 7. FIG. 7 illustrates a flow chart depicting a method 700 according to an example embodiment. The method 700 is performed by an apparatus that includes a delta-sigma modulator digital-to-analog converter section having a multiple stage cascaded error cancellation architecture including a first stage and a second stage, such as that shown in FIG. 2. At step 710, the method 700 includes receiving a digital input at a first delta-sigma modulator of the first stage, and at step 720, the method 700 includes subtracting an output of the first delta-sigma modulator from the digital input to produce a difference. At step 730, the method includes scaling the difference to produce a scaled difference that is provided as input to a second delta-sigma modulator of the second stage. At step 740, the method 700 includes converting, with a first digital-to-analog converter of the first stage, the output of the first delta-sigma modulator to produce a first analog signal. At step 750, the method 700 includes converting, with a second digital-to-analog converter of the second stage, an output of the second delta-sigma modulator to produce a second analog signal. At step 760, the method includes generating an analog output of the delta-sigma modulator digital-to-analog converter section based on a combination of the first analog signal and a scaled version of the second analog signal of the second digital-to-analog converter. At step 770, the method 700 includes filtering the analog output with an inverting amplifier-based analog filter to produce a filtered analog output. As explained above, the analog output is a current signal, and the method 700 may further include converting the current signal with the inverting amplifier-based analog filter to a voltage. Furthermore, the filtering of step 770 may include performing second order filtering of the analog output to produce the filtered analog output.

Variations and Implementations

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In some aspects, the techniques described herein relate to an apparatus including: a delta-sigma modulator digital-to-analog converter section having a multiple stage cascaded error cancellation architecture, each stage including a delta-sigma modulator followed by a digital-to-analog converter, the delta-sigma modulator digital-to-analog converter section configured to receive a digital input and to generate an analog output; and an inverting amplifier-based analog filter coupled to receive the analog output, the inverting amplifier-based analog filter configured to filter the analog output to produce a filtered analog output.

In some aspects, the analog output is a voltage signal, and the inverting amplifier-based analog filter is configured to perform filtering, to produce the filtered analog output.

In some aspects, the analog output is a current signal, and the inverting amplifier-based analog filter is configured to both convert the current signal to a voltage and to perform filtering to produce the filtered analog output.

In some aspects, the inverting amplifier-based analog filter is configured to perform second or higher order filtering.

In some aspects, the inverting amplifier-based analog filter includes a single operational amplifier.

In some aspects, the inverting amplifier-based analog filter includes a Rauch biquad filter topology.

In some aspects, the inverting amplifier-based analog filter includes a resistor-capacitor network coupled between an output of the single operational amplifier and an inverting input of the single operational amplifier.

In some aspects, the single operational amplifier includes a single inverter.

In some aspects, the single operational amplifier includes a multiple stage cascaded topology, with each stage including two inverters in transconductance/transconductance (gm/gm) configuration.

In some aspects, the single operational amplifier includes a multiple stage cascaded topology with Miller-compensation, where at least one stage includes an inverter and a resistor-capacitor combination coupled between an output and an input of the inverter, and a final stage having a transconductance/transconductance (gm/gm) configuration.

In some aspects, the delta-sigma modulator digital-to-analog converter section includes: a first stage and a second stage, wherein the first stage includes a first delta-sigma modulator configured to receive the digital input and a first digital-to-analog converter having an input coupled to an output of the first delta-sigma modulator, and the second stage includes a second delta-sigma modulator and a second digital-to-analog converter having an input coupled to an output of the second delta-sigma modulator; and an input to the second delta-sigma modulator being based on a scaled difference between the output of the first delta-sigma modulator and the digital input; the analog output of the delta-sigma modulator digital-to-analog converter section being based on a combination of a scaled output of the second digital-to-analog converter and an output of the first digital-to-analog converter.

In some aspects, the delta-sigma modulator digital-to-analog converter section further includes: a digital scaler having an input coupled to receive a difference between the output of the first delta-sigma modulator and the digital input, and an output coupled to the input of the second delta-sigma modulator, wherein the digital scaler is configured to apply a first scaling factor to the difference to produce the scaled difference; and an amplifier coupled to an output of the second digital-to-analog converter and configured to scale the output of the second digital-to-analog converter by a second scaling factor to produce the scaled output that is combined with the output of the first digital-to-analog converter to produce the analog output of the delta-sigma modulator digital-to-analog converter section.

In some aspects, the techniques described herein relate to an apparatus including: a delta-sigma modulator digital-to-analog converter section having a multiple stage cascaded error cancellation architecture including a first stage and a second stage, wherein the first stage includes a first delta-sigma modulator configured to receive a digital input and a first digital-to-analog converter having an input coupled to an output of the first delta-sigma modulator, and the second stage includes a second delta-sigma modulator and a second digital-to-analog converter having an input coupled to an output of the second delta-sigma modulator, an input to the second delta-sigma modulator being based on a scaled difference between the output of the first delta-sigma modulator and the digital input, an analog output of the delta-sigma modulator digital-to-analog converter section being based on a combination of a scaled output of the second digital-to-analog converter and an output of the first digital-to-analog converter; and an inverting amplifier-based analog filter coupled to receive the analog output, the inverting amplifier-based analog filter configured to filter the analog output to produce a filtered analog output, wherein the analog output is a current signal, and the inverting amplifier-based analog filter is configured to both convert the current signal to a voltage and to perform filtering to produce the filtered analog output.

In some aspects, the delta-sigma modulator digital-to-analog converter section further includes: a digital scaler having an input coupled to receive a difference between the output of the first delta-sigma modulator and the digital input, and an output coupled to the input of the second delta-sigma modulator, wherein the digital scaler is configured to apply a first scaling factor to the difference to produce the scaled difference; and an amplifier coupled to an output of the second digital-to-analog converter and configured to scale the output of the second digital-to-analog converter by a second scaling factor to produce the scaled output that is combined with the output of the first digital-to-analog converter to produce the analog output of the delta-sigma modulator digital-to-analog converter section.

In some aspects, the techniques described herein relate to a method including: at a delta-sigma modulator digital-to-analog converter section having a multiple stage cascaded error cancellation architecture including a first stage and a second stage, receiving a digital input at a first delta-sigma modulator of the first stage; subtracting an output of the first delta-sigma modulator from the digital input to produce a difference; scaling the difference to produce a scaled difference that is provided as input to a second delta-sigma modulator of the second stage; converting, with a first digital-to-analog converter of the first stage, the output of the first delta-sigma modulator to produce a first analog signal; converting, with a second digital-to-analog converter of the second stage, an output of the second delta-sigma modulator to produce a second analog signal; generating an analog output of the delta-sigma modulator digital-to-analog converter section being based on a combination of the first analog signal and a scaled version of the second analog signal of the second digital-to-analog converter; and filtering the analog output with an inverting amplifier-based analog filter to produce a filtered analog output.

In some aspects, the analog output is a current signal, and the method further includes: converting the current signal with the inverting amplifier-based analog filter to a voltage.

In some aspects, the filtering includes performing second order or higher filtering of the analog output to produce the filtered analog output.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
   a delta-sigma modulator digital-to-analog converter section having a multiple stage cascaded error cancellation architecture, each stage including a delta-sigma modulator followed by a digital-to-analog converter, the delta-sigma modulator digital-to-analog converter section configured to receive a digital input and to generate an analog output; and
   an inverting amplifier-based analog filter coupled to receive the analog output, the inverting amplifier-based analog filter configured to filter the analog output to produce a filtered analog output, wherein the analog output is a current signal, and wherein the inverting amplifier-based analog filter is configured to both convert the current signal to a voltage and to perform filtering to produce the filtered analog output.

2. The apparatus of claim 1, wherein the inverting amplifier-based analog filter is configured to perform second or higher order filtering.

3. The apparatus of claim 2, wherein the inverting amplifier-based analog filter comprises a single operational amplifier.

4. The apparatus of claim 3, wherein the inverting amplifier-based analog filter comprises a Rauch biquad filter topology.

5. The apparatus of claim 4, wherein the inverting amplifier-based analog filter comprises a resistor-capacitor network coupled between an output of the single operational amplifier and an inverting input of the single operational amplifier.

6. The apparatus of claim 5, wherein the single operational amplifier comprises a single inverter.

7. The apparatus of claim 5, wherein the single operational amplifier comprises a multiple stage cascaded topology, with each stage comprising two inverters in transconductance/transconductance (gm/gm) configuration.

8. The apparatus of claim 5, wherein the single operational amplifier comprises a multiple stage cascaded topology with Miller-compensation, where at least one stage includes an inverter and a resistor-capacitor combination coupled between an output and an input of the inverter, and a final stage having a transconductance/transconductance (gm/gm) configuration.

9. The apparatus of claim 1, wherein the delta-sigma modulator digital-to-analog converter section includes:
   a first stage and a second stage, wherein the first stage comprises a first delta-sigma modulator configured to receive the digital input and a first digital-to-analog converter having an input coupled to an output of the first delta-sigma modulator, and the second stage comprises a second delta-sigma modulator and a second digital-to-analog converter having an input coupled to an output of the second delta-sigma modulator; and
   an input to the second delta-sigma modulator being based on a scaled difference between the output of the first delta-sigma modulator and the digital input;
   the analog output of the delta-sigma modulator digital-to-analog converter section being based on a combination of a scaled output of the second digital-to-analog converter and an output of the first digital-to-analog converter.

10. The apparatus of claim 9, wherein the delta-sigma modulator digital-to-analog converter section further comprises:
    a digital scaler having an input coupled to receive a difference between the output of the first delta-sigma modulator and the digital input, and an output coupled to the input of the second delta-sigma modulator, wherein the digital scaler is configured to apply a first scaling factor to the difference to produce the scaled difference; and
    an amplifier coupled to an output of the second digital-to-analog converter and configured to scale the output of the second digital-to-analog converter by a second scaling factor to produce the scaled output that is combined with the output of the first digital-to-analog converter to produce the analog output of the delta-sigma modulator digital-to-analog converter section.

11. An apparatus comprising:
    a delta-sigma modulator digital-to-analog converter section having a multiple stage cascaded error cancellation architecture including a first stage and a second stage, wherein the first stage comprises a first delta-sigma modulator configured to receive a digital input and a first digital-to-analog converter having an input coupled to an output of the first delta-sigma modulator, and the second stage comprises a second delta-sigma modulator and a second digital-to-analog converter having an input coupled to an output of the second delta-sigma modulator, an input to the second delta-sigma modulator being based on a scaled difference between the output of the first delta-sigma modulator and the digital input, an analog output of the delta-sigma modulator digital-to-analog converter section being based on a combination of a scaled output of the second digital-to-analog converter and an output of the first digital-to-analog converter; and an inverting amplifier-based analog filter coupled to receive the analog output, the inverting amplifier-based analog filter configured to filter the analog output to produce a filtered analog output, wherein the analog output is a current signal, and the inverting amplifier-based analog filter is configured to both convert the current signal to a voltage and to perform filtering to produce the filtered analog output.

12. The apparatus of claim 11, wherein the delta-sigma modulator digital-to-analog converter section further comprises:

a digital scaler having an input coupled to receive a difference between the output of the first delta-sigma modulator and the digital input, and an output coupled to the input of the second delta-sigma modulator, wherein the digital scaler is configured to apply a first scaling factor to the difference to produce the scaled difference; and an amplifier coupled to an output of the second digital-to-analog converter and configured to scale the output of the second digital-to-analog converter by a second scaling factor to produce the scaled output that is combined with the output of the first digital-to-analog converter to produce the analog output of the delta-sigma modulator digital-to-analog converter section.

13. The apparatus of claim 11, wherein the inverting amplifier-based analog filter comprises a single operational amplifier.

14. The apparatus of claim 13 wherein the inverting amplifier-based analog filter comprises a Rauch biquad filter topology.

15. The apparatus of claim 14, wherein the inverting amplifier-based analog filter comprises a resistor-capacitor network coupled between an output of the single operational amplifier and an inverting input of the single operational amplifier.

16. A method comprising:

at a delta-sigma modulator digital-to-analog converter section having a multiple stage cascaded error cancellation architecture including a first stage and a second stage, receiving a digital input at a first delta-sigma modulator of the first stage;

subtracting an output of the first delta-sigma modulator from the digital input to produce a difference;

scaling the difference to produce a scaled difference that is provided as input to a second delta-sigma modulator of the second stage;

converting, with a first digital-to-analog converter of the first stage, the output of the first delta-sigma modulator to produce a first analog signal;

converting, with a second digital-to-analog converter of the second stage, an output of the second delta-sigma modulator to produce a second analog signal;

generating an analog output of the delta-sigma modulator digital-to-analog converter section being based on a combination of the first analog signal and a scaled version of the second analog signal of the second digital-to-analog converter, wherein the analog output is a current signal;

converting the current signal to a voltage signal with an inverting amplifier-based analog filter; and filtering the voltage signal with the inverting amplifier-based analog filter to produce a filtered analog output.

17. The method of claim 16, wherein filtering comprises performing second or higher order filtering of the analog output to produce the filtered analog output.

18. The method of claim 16, wherein an amplifier is coupled to the output of the second digital-to-analog converter, the method further comprising:

scaling the second analog signal with the amplifier to produce the scaled version of the second analog signal.

19. The method of claim 16, wherein the filtering includes using a single operational amplifier.

20. The method of claim 16, wherein the inverting amplifier-based analog filter uses a Rauch biquad filter topology.

* * * * *